United States Patent [19]
Tobin

[11] Patent Number: 6,156,124
[45] Date of Patent: Dec. 5, 2000

[54] WAFER TRANSFER STATION FOR A CHEMICAL MECHANICAL POLISHER

[75] Inventor: Jim Tobin, Fremont, Calif.

[73] Assignee: Applied Materials, Inc., Santa Clara, Calif.

[21] Appl. No.: 09/414,771

[22] Filed: Oct. 6, 1999

Related U.S. Application Data

[60] Provisional application No. 60/139,846, Jun. 18, 1999.

[51] Int. Cl.[7] .............................. B65G 49/07; C23F 1/00
[52] U.S. Cl. ........................ 118/719; 118/500; 414/935; 156/345
[58] Field of Search ........................... 156/345; 118/719, 118/500; 451/66; 414/935, 937, 939

[56] References Cited

U.S. PATENT DOCUMENTS

| | | | |
|---|---|---|---|
| 3,968,885 | 7/1976 | Hassan et al. | 118/719 |
| 5,180,276 | 1/1993 | Hendrickson | 414/937 |
| 5,447,409 | 9/1995 | Grunes et al. | 414/935 |
| 5,565,034 | 10/1996 | Nanbu et al. | 414/937 |
| 5,569,014 | 10/1996 | Hofmeister | 414/937 |
| 5,738,574 | 4/1998 | Tolles | 451/288 |
| 5,934,984 | 8/1999 | Togawa et al. | 451/288 |
| 5,944,940 | 8/1999 | Toshima | 438/716 |

Primary Examiner—Shrive Beck
Assistant Examiner—Sylvia R MacArthur
Attorney, Agent, or Firm—Thomason, Moser & Patterson

[57] ABSTRACT

A transfer station and concomitant method for a chemical mechanical polishing system comprising a pair of buffer stations and a transport robot. The buffer stations and the ability to transport two wafers simultaneously with the transfer robot minimizes the exchange time for loading and unloading wafers into the chemical mechanical polishing system. The lowering of the exchange time improves the number of wafers processed per hour by the chemical mechanical polishing system. The transfer robot utilizes wafer edge grip features, adjustable wafer gripper force, minimum wafer contact points, fluid media for wafer present sensing, and mechanical interlocking mechanisms to protect both the wafer and the transfer station.

37 Claims, 4 Drawing Sheets

6,156,124

WAFER TRANSFER STATION FOR A CHEMICAL MECHANICAL POLISHER

CLAIMS OF PRIORITY

This application claims benefit under 35 United States Code § 119 of U.S. Provisional Application No. 60/139,846, filed Jun. 18, 1999, which is hereby incorporated by reference.

BACKGROUND OF THE DISCLOSURE

1. Field of Invention

The present invention relates generally to a chemical mechanical polishing system. More specifically, the invention relates a method and apparatus for positioning a workpiece or semiconductor wafer into a chemical mechanical polishing system.

2. Background of Prior Art

In semiconductor wafer processing, the use of chemical mechanical polishing, or CMP, has gained favor due to the enhanced ability to stack multiple feature layers on a semiconductor workpiece, or wafer. As the demand for polishing wafers as part of a semiconductor fabrication process increases the requirement for higher processing rates while minimizing risk of wafer damage and contamination has correspondingly experienced greater urgency for improvement.

Two such CMP systems that address these issues are described in a commonly assigned patent to Perlov et al. (U.S. Pat. No. 5,804,507, issued Sep. 8, 1998) and in a commonly assigned patent to Tolles et al. (U.S. Pat. No. 5,738,574, issued Apr. 15, 1998). Both Perlov et al. and Tolles et al. are hereby incorporated by reference. Both Perlov et al. and Tolles et al. disclose a CMP system having a polishing apparatus that is supplied wafers from cassettes located in an adjacent liquid filled bath. A transfer mechanism, or robot, facilitates the transfer of the wafers from the bath to a transfer station. A pedestal within the transfer station rises to receive the wafer from the robot. The wafer is released from the robot and secured, or chucked, to the pedestal by a vacuum chuck. The pedestal is then retracted into the transfer station wherein the wafer is temporarily released from the pedestal so that a plurality of alignment jaws may manipulate the wafer into a position centered upon the pedestal. The wafer is then re-chucked to the pedestal and the pedestal rises to engage and transfer the wafer to a retaining ring of a polishing head. The alignment of the wafer to the center of the pedestal ensures that the wafer will be properly fixtured into the retaining ring. After the wafer is fixtured into the retaining ring, a carousel moves the polishing head to a polishing station. After completion of the polishing process, the wafer is returned to the pedestal where a robot retrieves the wafer and moves it to the proper cassette located in the bath.

Although this process has proven to be an effective mechanism for performing chemical mechanical polishing, an improvement has been identified which could enhance the transfer of the wafer into the polishing head, reducing the risk of wafer damage and contamination, while reducing the dwell time of the wafer at the transfer station.

More specifically, the process of transferring the wafer into and out of a single load/unload pedestal with a transfer robot that can only transport one wafer at a time causes a bottleneck in wafer movement into and out of the polisher. Specifically, a single arm robot with a single end effector for gripping a wafer obtains a wafer from a wafer storage device, positions the wafer upon a single load/unload pedestal. The wafer enters the polisher and work is polished. The wafer is then returned to the load/unload pedestal for unloading and transporting to a wafer storage device. The single arm robot must then grip the processed wafer and transport it to a wafer storage device, place the wafer in the device, and index down and retrieve the next wafer to be processed in the polisher. The robot then transports the next wafer to the load/unload pedestal for drop off. Elimination of the dwell time or the dead time in which the load/unload pedestal is idle would improve the routing time required to process each wafer, and yield a corresponding increase in wafer throughput. Additionally, the use of wafer edge grip only would minimize physical contact with either the backside surface or the device surface of the wafer during transporting and wafer placement. This is of special concern since any abrasion, scratching or other damage could occur on either side of the wafer.

Therefore, there is a need in the art for an apparatus that facilitates wafer transfer into a CMP polishing head wherein the transfer time is reduced and the wafer is fixtured with a minimal risk of particulate contamination and wafer damage.

SUMMARY OF INVENTION

The disadvantages associated with the prior art are overcome by the present invention of a transfer station comprising at least one buffer station, a transfer robot, and a wafer loading assembly. Preferably, a plurality of buffer stations is used, e.g., an input buffer station and an output buffer station. In operation, an input/output robot places a semiconductor wafer into an input buffer station. The input buffer station supports the wafer on three pins proximate the edge of the wafer. The transfer robot has two gripper assemblies, each having pneumatic gripper fingers that grab the wafer. The fingers retain the wafer at three points on the edge of the wafer. The robot lifts the wafer from the input buffer station and rotates the gripper and wafer to position the wafer over the wafer load/unload assembly, then places the wafer down onto the load/unload assembly. The wafer load/unload assembly then loads the wafer into a polishing head of the chemical mechanical polisher. While the transfer robot is positioning the wafer into the wafer load/unload assembly, the input/output robot may be positioning another wafer upon the input buffer station. Once a wafer has completed the polishing process, the polishing head releases the wafer into the wafer load/unload assembly, and the transfer robot removes the wafer from the load/unload assembly. The polished wafer is then placed in the output buffer station by the transfer robot where it remains until the input/output robot removes the polished wafer from the transfer station. As the transfer robot has two gripper assemblies, the steps of releasing the wafer into the load/unload assembly and the output buffer can occur simultaneously.

More specifically, the transfer robot comprises a pair of opposing gripper assemblies that are pneumatically actuated. Each of the gripper assemblies is located on opposing distal ends of two transfer arms. At a point where the transfer arms meet forming preferably a right angle, the transfer arms are coupled to a rotary actuator and a vertical linear actuator such that the grippers can be rotated from the buffer stations to the load/unload assembly and the robot arms can be raised and lowered to facilitate loading and unloading wafers. The grippers themselves have three fingers, plastic cylinders with a notch cut into the cylinder, to grip the edge of the wafer therein. The grippers are biased in an open position by springs such that the distance between the fingers of each gripper is greater than the diameter of a wafer. When compressed air is forced into a pneumatic cylinder, the grippers move towards one another and a wafer is captured between the three fingers.

Each of the transfer arms has a gripper assembly located at a first end and terminates in a second end that is mounted to a vertical shaft. The shaft is coupled to a rotary actuator through a clutch such that the arm can be rotated about 350 degrees. The shaft is coupled to an interlock mechanism that ensures that the transfer robot is properly position over either a buffer station or the wafer load/unload assembly before the transfer robot is allowed to be lowered into the buffer stations or the loadcup to release or pick-up a wafer. The interlock also ensures that the transfer robot cannot rotate toward the wafer load/unload assembly when that assembly is loading (or unloading) a wafer into the polishing head. To allow the robot to access either of the buffer stations and the wafer load/unload assembly, the buffer station and the wafer load/unload assembly are aligned along a circular path having the shaft of the transfer robot at its center.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

Figure 1:
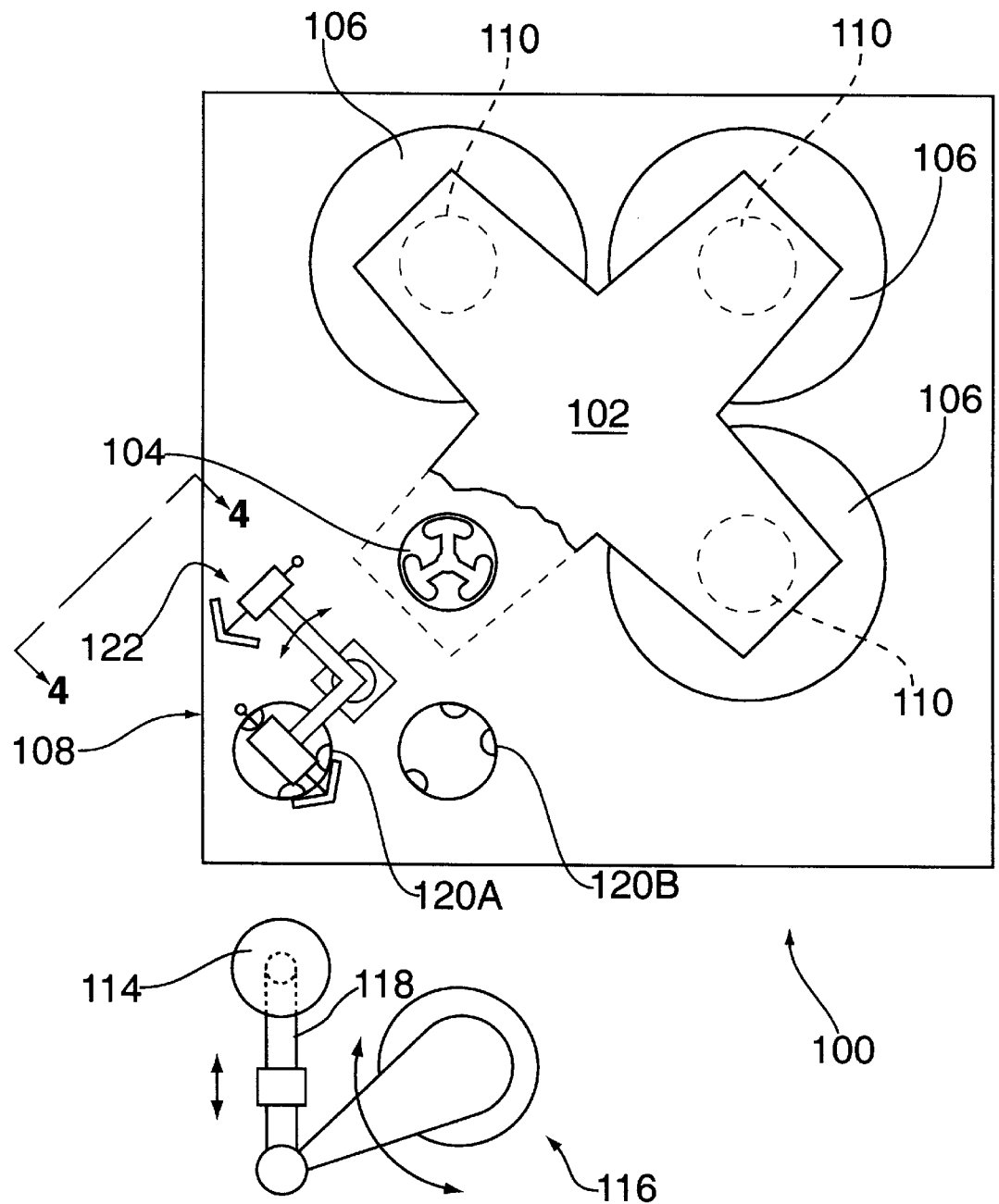
FIG. 1 depicts a schematic top plan view of an illustrative chemical mechanical polisher comprising the present invention.

FIG. 1 depicts a schematic top plan view of a chemical mechanical polisher 100. The polisher 100 has a plurality of polishing stations 106 (e.g., three), a carousel 102 that supports four polishing heads 110, a wafer load/unload assembly 104, and a transfer station 108. An input/output robot 116 loads and unloads wafers 114 to/from the transfer station 108. Four polishing heads 110 are mounted in the carousel 102. The carousel 102 is partially cut-away to provide a view of the components of the transfer station 108. As such, one of the four polishing heads 110 is not shown. The carousel 102 rotates about a central axis such that any one of the polishing heads 110 may be positioned at any one of the polishing stations 106 or the transfer station 108. Consequently, the wafer 114 can be loaded into a particular polishing head 110, and the carousel 102 can move the head 110 to a particular polishing station 106.

The wafer 114 is transferred between the polisher 100 and other systems (e.g., wafer cleaners) or wafer cassettes (not shown) via the wafer input/output robot 116. The input/output robot 116 has a gripper 118 (e.g., a vacuum gripper) that retains the wafer 114 during transfer, and sets the wafer 114 into the transfer station 108.

The transfer station 108 comprises at least one buffer station 120 (preferably, two buffer stations 120A and 120B) and a transfer robot 122. The input/output robot 116 places the wafer 114 that is entering the polisher 100 into the input buffer station 120B. The input buffer station 120B is stationary. After the transfer station 108 receives the wafer 114 from the robot 116 and the robot 116 has cleared the transfer station 108, the transfer station robot 122 retrieves the wafer 114 from the input buffer station 120B and moves the wafer 114 to the wafer load/unload assembly 104. The wafer load/unload assembly 104 may be of any type known in the art for positioning the wafer 114 into a polishing head 110. Preferably, the wafer load/unload assembly 104 is a load cup that is described in commonly assigned U.S. provisional patent application 60/139,144, filed Jun. 14, 1999, (Attorney Docket Number 3650L) and incorporated herein by reference. The carousel 102 retrieves the wafer 114 from the wafer load/unload assembly 104 and proceeds to polish the wafer 114. While the transfer robot 122 is busy moving a wafer 114 from the buffer station 120 to the wafer load/unload assembly 104, the input/output robot 116 may position another wafer 114 into the empty input buffer station 120B.

When the wafer 114 has completed a polishing procedure, the carousel 102 moves the wafer 114 to the wafer load/unload assembly 104 and releases the wafer 114. The transfer robot 122 then retrieves the wafer 114 from the wafer load/unload assembly 104 and places the wafer 114 into the output buffer station 120A. The polished wafer 114 is then retrieved from the output buffer station 120B by the input/output robot 116.

In operation, the transfer robot 122 is centrally located between the buffer stations 120A, 120B and the wafer load/unload assembly 104. Specifically, the robot 122 has a central axis of rotation that is concentric with an imaginary circle that passes through the center of buffer stations 120A, 120B and the wafer load/unload assembly 104 such that the transfer robot 122 reaches these locations without using an articulating arm. Of course, one skilled in the art may readily substitute other variations of robots while maintaining the ability to position the wafer 114 in the buffer stations 120A, 120B and the wafer load/unload assembly 104.

Figure 2:
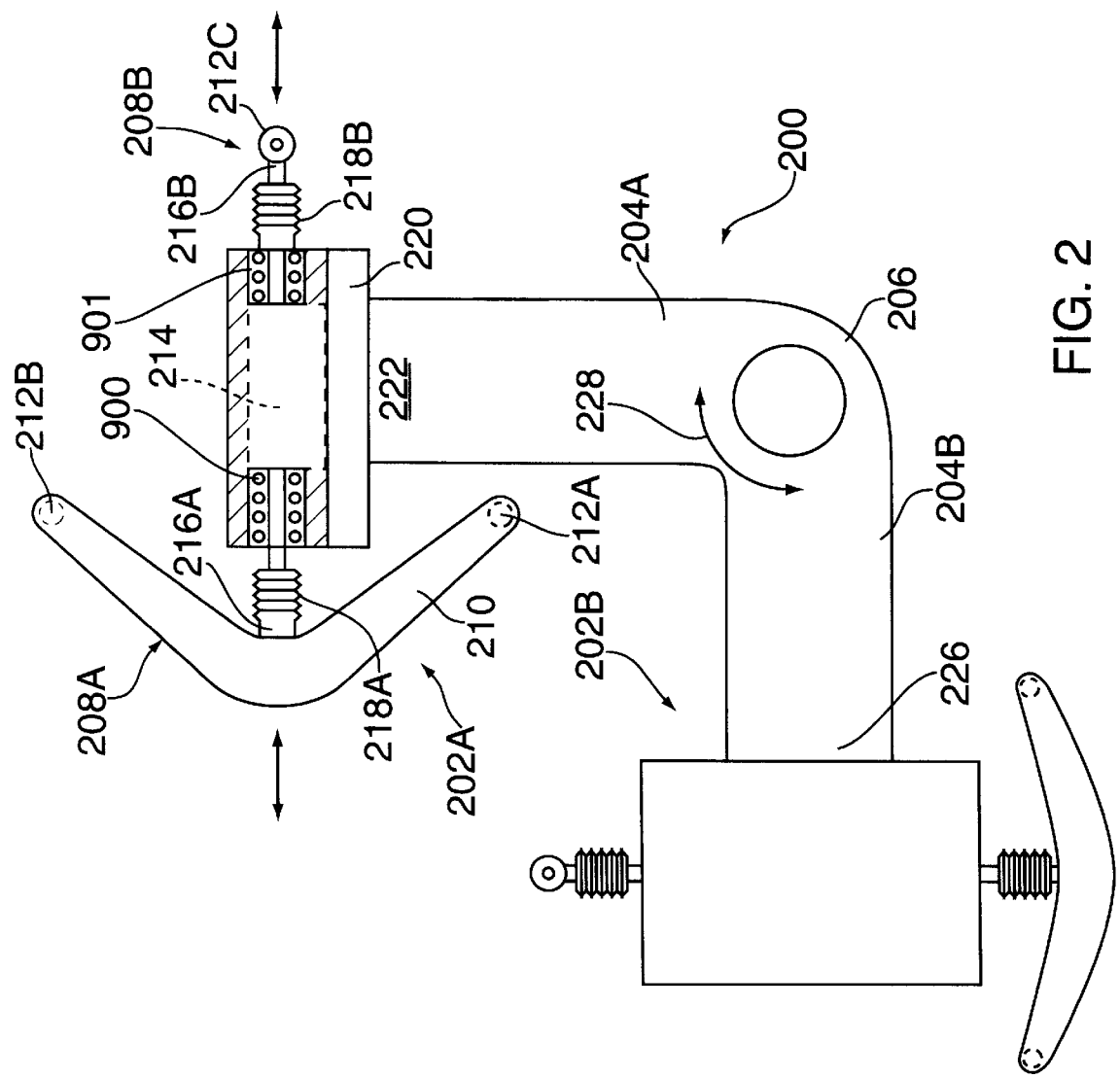
FIG. 2 depicts a top plan view of the arm assembly of the transfer robot.

FIG. 2 depicts a top plan view of an arm assembly 200 of the transfer robot (122 of FIG. 1). The arm assembly 200 comprises a pair of identical gripper assemblies 202A and 202B, a pair of transfer arms 204A and 204B, and an arm mounting location 206. The gripper assembly 202A (gripper assembly 202B is identically composed) comprises a pair of opposing grippers 208A and 208B. The gripper 208A comprises a gripper arm 210 and a pair of fingers 212A, 212B. The gripper arm 210 has a chevron shape with the point of the chevron facing outwards. The gripper 208B has a single finger 212C. Each of the fingers 212A, 212B are downwardly pointing and are located proximate the distal ends of the gripper arm 210. Finger 212C is downwardly pointing and lies in a plane with the other two fingers 212A and 212B. The center portion of the gripper arm 210 is coupled to a linear actuator 214. The actuator 214 has a pair of actuator shafts 216A and 216B that protrude in opposite directions from the actuator 214. The shaft 216A couples the actuator 214 to the gripper arm 210 and the shaft 216B couples the actuator 214 to the finger 212C that forms gripper 208B. The shafts 216A and 216B as well as the actuator 214 are protected from particulate contamination by a pair of bellows 218A and 218B surrounding each shaft and abutting an actuator housing 220.

The gripper assemblies 202A and 202B permit the transfer robot 112 to simultaneously hold wafers in each assembly. This allows the transfer robot 112 to place the polished wafer into the output buffer station 120A while simultaneously placing the unpolished wafer into the load/unload assembly 104.

The actuator 214 is a linear actuator that moves the shafts 216A and 216B inward and outward from the housing 220. Shafts 216A and 216B are supported on linear bearings 900 and 901 to minimize side loads into the linear actuator. One example of an actuator 214 is a pneumatic actuator that moves the shafts in response to air pressure. Such an actuator 214 has the shafts 216A and 216B biased outwardly by springs (not shown) that maintain the grippers 208A and 208B apart from one another in an open position. In the open position, the spacing between the fingers is larger than the diameter the wafer (e.g., 100, mm, 200 mm, or 300 mm). When pressurized air is supplied to the actuator 214, the actuator 214 moves the shafts 216 inwardly to cause the fingers 212A, 212B, and 212C to grip and retain a wafer (not shown in FIG. 2). Force applied to the fingers 212A, 212B and 212C, and hence the wafer 114, is proportional to the air pressure applied to the pneumatic actuator and can be regulated to minimize the force, thus substantially preventing wafer damage and contamination. Alternative linear actuators include, but are not limited to, worm gear assemblies, solenoids, rack and pinion assemblies, bell cranks, and the like. Additionally, more fingers and/or fingers of various shapes and sizes could be provided to facilitate wafer gripping.

Figure 3:
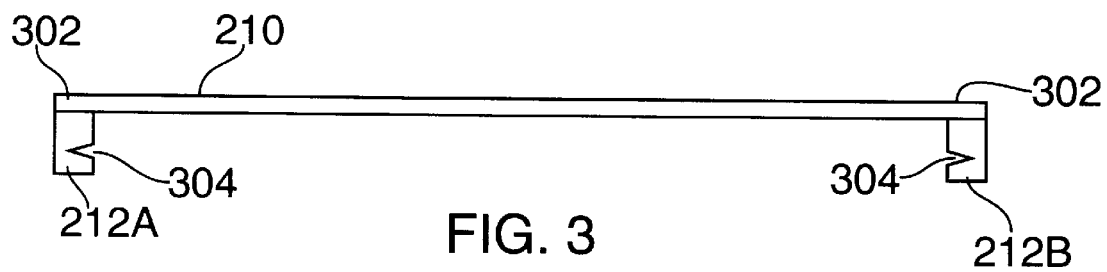
FIG. 3 depicts a side view of one gripper.

FIG. 3 depicts side view of the gripper arm 210, and its associated fingers 212A and 212B that are bolted proximate the ends 302 of the arm 210. Each finger has a cylindrical shape containing a notch 304 cut into a side of the cylinder. These notches 304 have an opening that is larger than the thickness of a wafer. Generally, the fingers are fabricated of a non-abrasive material such as plastic.

Returning to FIG. 2, the actuator housing 220 is attached to a distal end 222 (a first end) of the arm 204A. The arm 204A is connected to the arm 204B having a second gripper assembly 202B coupled to the distal end 226 thereof. The arms 204B and 204A at an angle to each other, preferably forming a right angle with respect to one another. At the point 206 that arms 204A and 204B meet, the arms are attached to the robot's rotary and vertical actuators (not shown). As shall be described below, the robot is coupled to a rotary actuator that rotates the arm as indicated by arrow 228.

Figure 4:
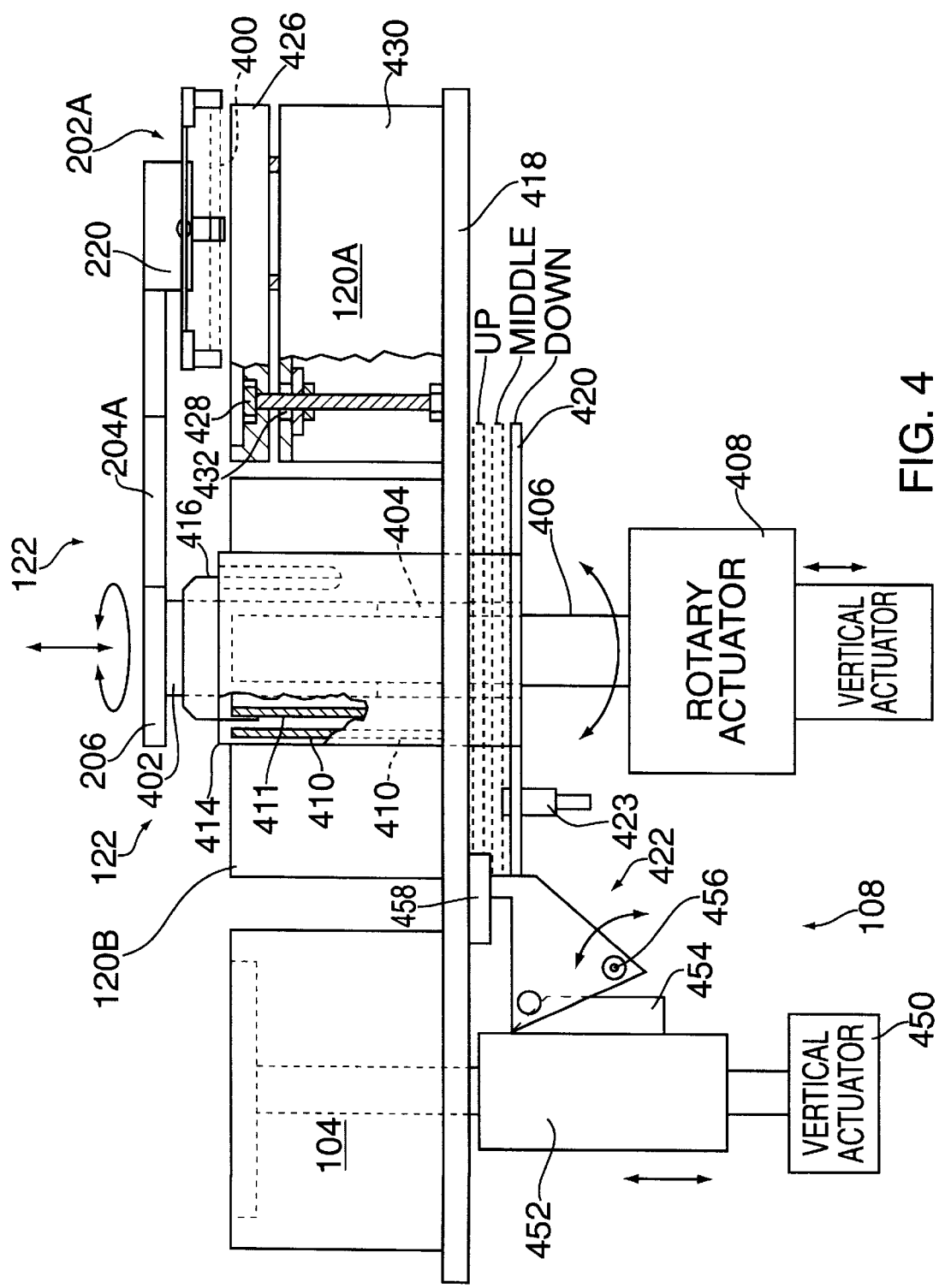
FIG. 4 depicts a side view of the transfer station.

FIG. 4 depicts a side plan view of the transfer station 108 comprising the transfer robot 122 carrying a wafer 400 and one of the buffer stations, e.g., station 120A, in partial cross section. For completeness, also depicted is the wafer load/unload assembly 104. The transfer robot 122, the wafer load/unload assembly 104 and the buffer stations 120A, 120B are mounted to a common base plate 418 for the transfer station 108.

As discussed previously, the arm 204A of the transfer robot 122 couples the gripper assembly 202A to the mounting point 206. The mounting point 206 is affixed to a tube shaft 402. The tube shaft 402 and a spindle 406 are co-axially assembled and mechanically form a slip clutch 404. A rotary actuator 408 rotationally drives the spindle 406. The slip clutch 404 ensures that the rotary actuator 408 and spindle 406 are able to rotate without being damaged if the robot arm 204 were to malfunction and become unable to move, i.e., become stuck. The clutch 404 and tube shaft 402 pass concentrically through protective cylinders 410 and 411. The protective cylinders 410 and 411 are fastened to the base plate 418. The shield 416 and protective cylinders 410 and 411 form a labyrinth seal 401 that impedes the slurry from the polishing process from interfering with the operation of the clutch 404 and other lower mechanisms.

Figure 6:
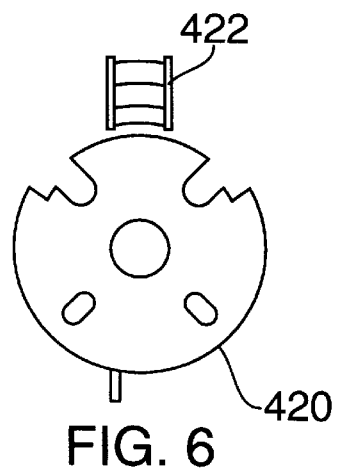
FIG. 6 depicts a top plan view of the cam plate.

The transfer robot 122 further comprises a cam plate 420 that is affixed to and rotates with the tube shaft 402. The cam plate 420 interacts with an interlock assembly 422 and a pin 423. The interlock assembly 422 ensures that the transfer robot 122 can not rotate towards the wafer load/unload assembly 104 and make contact when the loading/unloading assembly 104 is loading a wafer 400 into the polishing head. The load/unload assembly 104 comprises a vertical actuator 450 that drives a shaft 452 for lifting the wafer 400 into the polishing head. The shaft 452 has a linear cam 454 that abuts the interlock cam 422. When the load/unload assembly 104 rises, causing the interlock cam 454 to rotate outward on pivot 456. This rotation causes the outer edge of the interlock cam 454 to interact with the cam plate 420. As shown in FIG. 6, the cam plate 420 is an irregular shape that allows the transfer robot 122 to rotate freely between the buffer stations. However, when the transfer robot 122 rotates toward the load/unload assembly 104, the cam plate 420 abuts the interlock assembly 422 and rotation is halted. When rotation is halted, the clutch 404 will slip, ensuring that the transfer robot 122 does not impact the load/unload assembly 104.

Returning to FIG. 4, the transfer robot 122 operates in three vertical positions. The down position is a position that is used to retrieve or place wafers onto the load/unload assembly 104 or either of the buffer stations 120A or 120B. The pin 423 interacts with holes and slots in the cam plate 420 to ensure that the transfer robot 122 does not rotate when the transfer robot 122 is in a down position, and that the transfer robot 122 lowers in the angular position to the load/unload assembly 104 and buffer stations 120A and 120B. When the pin 423 is in a hole or slot, the transfer robot 122 cannot rotate. In the middle position, the cam plate 420 does not interact with the pin 423 and the transfer robot 122 may freely rotate about 350 degrees, unless the wafer load/unload assembly 104 is loading a wafer 400 into a polishing head 110. Lastly, in the up position, which is used to allow the input/output robot 116 to access the buffer stations while the transfer robot 122 is aligned with the buffer stations, the transfer robot 122 can rotate proximate the buffer stations. However, flange 458 will abut the cam plate 420 if the transfer robot 122 attempts to rotate toward the wafer load/unload assembly 104. This ensures that the transfer robot 122 cannot impact the polishing head 110 while rotating in the up position.

The buffer station 120 comprises a wafer support 426 that is supported by a plurality of bolts 428 above the base plate 418. The bores 432 in the wafer support 426 are much larger than the bolt 428 diameter such that the wafer support 426 can move laterally with respect to the base plate 418. This feature allows the buffer station to be aligned with the radial and angular position of the transfer robot 122 at the drop-off or pick-up location specified by the transfer robot position during setup. With a wafer 400 in the transfer robot grippers and at the desired position for wafer transfer, the buffer station is located beneath the supported wafer and the transfer robot 122 lowers the wafer 400 down to the set vertical distance fixed by an adjustment screw on the transfer robot 122. The wafer support 426 is aligned vertically and laterally to be concentric to the held wafer. The wafer support is affixed to the base plate by fasteners.

Figure 5:
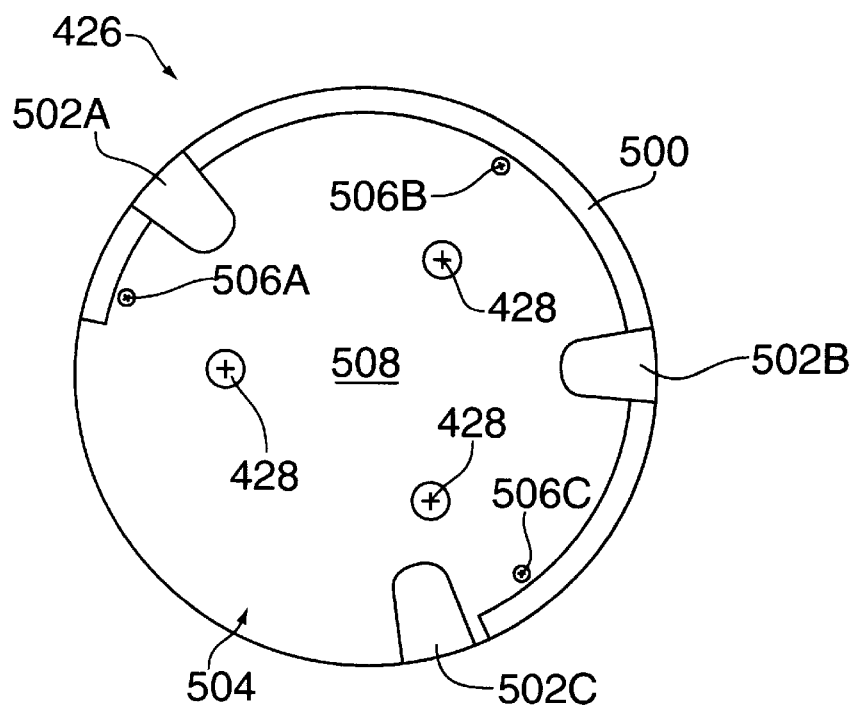
FIG. 5 depicts a top plan view of the buffer station.

FIG. 5 depicts a top plan view of the wafer support 426. The wafer support 426 is circular in plan form and comprises a circumferential lip 500, three cut outs 502A, 502B and 502C, mounting bolts 428, and wafer support pins 506A, 506B, and 506C. The circumferential lip 500 rises above the plane of a central portion 508 of the wafer support 426 such that a wafer will not slide off of the support when resting on the three wafer support pins. There is a gap 504 in the lip 500 to permit access to the wafer support 426 by the input/output robot 116. The cut outs 502A, 502B, and 502C are provided to enable the gripper fingers to access a wafer.

A wafer rests above the plane of the central portion 508 upon pins 506A, 506B and 506C. The pins could be solid; however, to facilitate wafer detection, the pins are hollow. As such, a fluid (water) is pumped through a pathway in the pins. The flow of water is monitored to detect flow change when a wafer is present. Such a change in flow is used to indicate when a wafer is positioned on a buffer station. The small fluid (water) film between the wafer and the support pins ensures that the wafer does not contact the pin and thereby minimizes particle contamination to the wafer surfaces. A detailed description of the wafer detection technique is provided in the commonly assigned U.S. patent application Ser. No. 60/139,144, Attorney Docket No. 3650, filed Jun. 14, 1999, and is hereby incorporated by reference.

Although the embodiment disclosed above which incorporate the teachings of the present invention has been shown and described in detail herein, those skilled in the art can readily devise other varied embodiments, which still incorporate the teachings and do not depart from the spirit of the invention.

What is claimed is:

1. Apparatus for positioning workpieces comprising:
   at least one buffer station;
   a transfer robot having a first transfer arm having a first gripper assembly, a second transfer arm disposed at an angle to said first transfer arm, said second transfer arm having a second gripper assembly, said first gripper assembly and said second gripper assembly being radially fixed relative to a center of rotation of said transfer robot; and,
   a load/unload assembly, wherein said first gripper assembly positions one of said workpieces on said buffer station while said second gripper assembly positions another of said workpieces on said load/unload assembly.

2. The apparatus of claim 1 wherein said at least one buffer station further comprises:
   a loading station; and,
   an unloading station.

3. The apparatus of claim 1 wherein said first gripper assembly and said second gripper assembly each further comprise:
   a plurality of gripper fingers.

4. The apparatus of claim 1 wherein said transfer robot further comprises:
   a rotatable tube shaft comprising slip clutch.

5. The apparatus of claim 4 wherein said transfer robot further comprises:
   a shield circumscribing said tube shaft; and,
   a first cylinder and a second cylinder concentrically disposed about said tube shaft, said shield, said first cylinder and said second cylinder defining a labyrinth seal.

6. The apparatus of claim 4 wherein said transfer robot further comprises:
   a cam plate affixed to said tube shaft.

7. The apparatus of claim 6 wherein said transfer robot further comprises:
   an interlock assembly and a pin, said interlock assembly and said pin selectively engaging said cam plate in a position preventing rotation of said transfer robot.

8. The apparatus of claim 1 further comprising:
   a chemical mechanical polisher.

9. The apparatus of claim 1 wherein said load/unload assembly further comprises:
   a linear actuator.

10. The apparatus of claim 1 further comprising:
    a base plate connected to said buffer station, said transfer robot, and said load/unload assembly.

11. Apparatus for positioning workpieces comprising:
    a buffer station having an input and an output buffer;
    a transfer robot having a first transfer arm having a first gripper assembly, a second transfer arm disposed at an angle to said first transfer arm, said second transfer arm having a second gripper assembly, said first gripper assembly and said second gripper assembly being radially fixed relative to a center of rotation of rotation of said transfer robot; and,
    a load/unload assembly, wherein said first gripper assembly of said transfer robot positions said workpieces on said buffer station and said load/unload assembly.

12. The apparatus of claim 11 wherein said load/unload assembly is disposed within a chemical mechanical polisher.

13. The apparatus of claim 12 wherein said first and said second gripper assemblies each further comprise:
    a plurality of gripper fingers, each of said gripper fingers having a notch, said notch selectively securing said workpiece by an edge.

14. The apparatus of claim 12 wherein said transfer robot further comprises:
    a rotatable tube shaft comprising slip clutch.

15. The apparatus of claim 14 wherein said transfer robot further comprises:
    a shield circumscribing said tube shaft, and,
    a first cylinder and a second cylinder concentrically disposed about said tube shaft, said shield, said first cylinder and said second cylinder defining a labyrinth seal.

16. The apparatus of claim 14 wherein said transfer robot further comprises:
    a cam plate affixed to said tube shaft.

17. The apparatus of claim 16 wherein said transfer robot further comprises:
    an interlock assembly and a pin, said interlock assembly and said pin selectively engaging said cam plate in a position preventing rotation.

18. A chemical mechanical polisher comprising:
    a plurality of polishing stations;
    at least one buffer station adapted to receive a workpiece;
    a transfer robot having a first gripper assembly and second gripper assembly; and,
    a load/unload assembly, wherein said first gripper assembly positions said workpiece on said buffer station and said second gripper assembly positions said workpiece on said load/unload assembly.

19. The chemical mechanical polisher of claim 18 wherein said transfer robot further comprises:
    a rotatable tube shaft said first gripper assembly and said second gripper assembly coupled to said tube shaft;
    a slip clutch disposed within said tube shaft;
    a cam plate affixed to said tube shaft;
    a shield circumscribing said tube shaft;

a first cylinder and a second cylinder concentrically disposed about said tube shaft, said shield, said first cylinder and said second cylinder defining a labyrinth seal; and, an interlock assembly and a pin, said interlock assembly and said pin selectively engaging said cam plate in a position preventing rotation.

20. A method for positioning a workpiece comprising the steps of:

retrieving an first workpiece in a first gripper assembly of a transfer robot;

retrieving a second workpiece in a second gripper assembly of the transfer robot;

placing the first workpiece in a load/unload assembly; and, placing the second workpiece in an output buffer station wherein said first gripper assembly and said gripper assembly are radially fixed in reference to a center of rotation of the transfer robot of rotation of said transfer robot.

21. The method of claim 20 wherein the step of retrieving the first wafer further comprise the steps of:

actuating the transfer robot into a lower position; and preventing the transfer robot from rotating.

22. The method of claim 20 wherein the steps of placing the first workpiece in the load/unload assembly and placing the second workpiece in the output buffer station occur simultaneously.

23. The method of claim 21 wherein the first workpiece is an unpolished wafer and the second workpiece is a polished wafer.

24. Apparatus for positioning workpieces comprising:

at least one buffer station;

a transfer robot having a rotatable tube shaft comprising a slip clutch; and, a load/unload assembly, wherein said transfer robot positions said workpieces selectively on said buffer station and said load/unload assembly.

25. The apparatus of claim 24 wherein said transfer robot further comprises:

a shield circumscribing said tube shaft; and, a first cylinder and a second cylinder concentrically disposed about said tube shaft, said shield, said first cylinder and said second cylinder defining a labyrinth seal.

26. The apparatus of claim 25, wherein said transfer robot further comprises:

a cam plate affixed to said tube shaft.

27. The apparatus of claim 26, wherein said transfer robot further comprises:

an interlock assembly and a pin, said interlock assembly and said pin selectively engaging said cam plate in a position preventing rotation of said transfer robot.

28. Apparatus for positioning workpieces comprising:

a buffer station having an input and an output buffer;

a transfer robot having a first and a second gripper; and, a load/unload assembly disposed within a chemical mechanical polisher, wherein said transfer robot positions said workpieces selectively on said buffer station and said load/unload assembly.

29. The apparatus of claim 28, wherein said load/unload assembly further comprises:

a linear actuator.

30. The apparatus of claim 28 further comprising:

a base plate connected to said buffer station, said transfer robot, and said load/unload assembly.

31. The apparatus of claim 28 wherein said first and said second gripper each further comprise:

a plurality of gripper fingers, each of said gripper fingers having a notch, said notch selectively securing said workpiece by an edge.

32. The apparatus of claim 28, wherein said transfer robot further comprises:

a rotatable tube shaft comprising slip clutch.

33. The apparatus of claim 32 wherein said transfer robot further comprises:

a shield circumscribing said tube shaft, and, a first cylinder and a second cylinder concentrically disposed about said tube shaft, said shield, said first cylinder and said second cylinder defining a labyrinth seal.

34. The apparatus of claim 32 wherein said transfer robot further comprises:

a cam plate affixed to said tube shaft.

35. The apparatus of claim 34 wherein said transfer robot further comprises:

an interlock assembly and a pin, said interlock assembly and said pin selectively engaging said cam plate in a position preventing rotation.

36. The apparatus of claim 28 wherein the transfer robot positions the workpieces simultaneously on said buffer station and said load/unload assembly.

37. A method for positioning a workpiece comprising the steps of:

retrieving an first workpiece in a first gripper of a transfer robot by actuating the transfer robot into a lower position and preventing the transfer robot from rotating;

retrieving a second workpiece in a second gripper of the transfer robot;

placing the first workpiece in a load/unload assembly; and, placing the second workpiece in an output buffer station.

* * * * *

UNITED STATES PATENT AND TRADEMARK OFFICE
CERTIFICATE OF CORRECTION

PATENT NO. : 6,156,124
DATED : December 5, 2000
INVENTOR(S) : Jim Tobin

It is certified that error appears in the above-identified patent and that said Letters Patent is hereby corrected as shown below:

Claim 11, Column 8,
Line 13; after "output buffer", insert -- station --;

Claim 20, Column 9,
Lines 18-20; after "center of rotation of the transfer robot", delete "of rotation of said transfer robot".

Signed and Sealed this

Twenty-fifth Day of September, 2001

Attest:

NICHOLAS P. GODICI
Attesting Officer
Acting Director of the United States Patent and Trademark Office